United States Patent
Hao et al.

(10) Patent No.: US 9,568,502 B2
(45) Date of Patent: Feb. 14, 2017

(54) VISUAL ANALYTICS OF SPATIAL TIME SERIES DATA USING A PIXEL CALENDAR TREE

(71) Applicant: Hewlett-Packard Development Company, L.P., Fort Collins, CO (US)

(72) Inventors: Ming C Hao, Palo Alto, CA (US); Halldor Janetzko, Konstanz (DE); Manish Marwah, Palo Alto, CA (US); Umeshwar Dayal, Saratoga, CA (US); Meichun Hsu, Los Altos Hills, CA (US); Daniel Keim, Steisslingen (DE)

(73) Assignee: Hewlett Packard Enterprise Development LP, Houston, TX (US)

( * ) Notice: Subject to any disclaimer, the term of this patent is extended or adjusted under 35 U.S.C. 154(b) by 898 days.

(21) Appl. No.: 13/912,090

(22) Filed: Jun. 6, 2013

(65) Prior Publication Data

US 2014/0365149 A1 Dec. 11, 2014

(51) Int. Cl.
*G06T 11/20* (2006.01)
*G01R 13/02* (2006.01)
(Continued)

(52) U.S. Cl.
CPC ............ *G01R 13/02* (2013.01); *G01D 4/004* (2013.01); *G06Q 50/06* (2013.01); *Y02B 90/242* (2013.01);
(Continued)

(58) Field of Classification Search
CPC .................................................. G01T 11/206
(Continued)

(56) References Cited

U.S. PATENT DOCUMENTS

2004/0239494 A1* 12/2004 Kennedy ............... G06Q 30/02
340/500
2010/0283606 A1* 11/2010 Tsypin .................. G06Q 30/02
340/540
(Continued)

OTHER PUBLICATIONS

B. Lange, "Energy Consumption Improvement Through a Visualization Software," Apr. 2, 2012, http://cdn.intechopen.com/pdfs/31597/InTech-Energy_consumption_improvement_through_a_visualization_software.pdf.
(Continued)

*Primary Examiner* — Lam Nguyen
(74) *Attorney, Agent, or Firm* — Hewlett Packard Enterprise Patent Department

(57) ABSTRACT

Example embodiments relate to providing visual analytics of spatial time series data. In example embodiments, sensors may be located at regions within a building for collecting sensor data at regular time intervals. A sensor hierarchy can be generated including sensor nodes that are hierarchically arranged according to a physical infrastructure of the building, where each of the sensor nodes corresponds to a sensor. Sensor data can be obtained from the sensors, and a pixel calendar tree can be generated based on the sensor data and the sensor hierarchy, where the pixel calendar tree is recursively subdivided into tree portions according to a proportion of the sensor data attributable to each of the sensors. The pixel calendar tree can be displayed, where each of the tree portions includes time series sensor data of a corresponding region that is generated based on the sensor data.

15 Claims, 7 Drawing Sheets
(3 of 7 Drawing Sheet(s) Filed in Color)

(51) Int. Cl.
*G06Q 50/06* (2012.01)
*G01D 4/00* (2006.01)
(52) U.S. Cl.
CPC ............. *Y02B 90/245* (2013.01); *Y02B 90/246* (2013.01); *Y04S 20/322* (2013.01); *Y04S 20/40* (2013.01); *Y04S 20/42* (2013.01); *Y04S 20/46* (2013.01)
(58) Field of Classification Search
USPC ... 345/440.2, 440, 428; 340/500, 540, 572.1
See application file for complete search history.

(56) References Cited

U.S. PATENT DOCUMENTS

| | | |
|---|---|---|
| 2012/0035776 A1 | 2/2012 | Zaragoza et al. |
| 2012/0240072 A1 | 9/2012 | Altamura et al. |
| 2012/0259583 A1 | 10/2012 | Noboa et al. |
| 2014/0078151 A1* | 3/2014 | Garr ................... G06T 11/206 345/440.2 |

OTHER PUBLICATIONS

J.J.V. Wijk, "Cluster and Calendar Based Visualization of Time Series Data," Oct. 25-26, 1999, http://www.cs.ubc.ca/~tmm/courses/old533/readings/vanwijk99cluster.pdf.

M.O. Ward, "Visual Exploration of Time-series Data with Shape Space Projections," Jun. 28, 2011, http://davis.wpi.edu/~xmdv/docs/EuroVis11-ward.pdf, vol. 30, Issue 3.

* cited by examiner

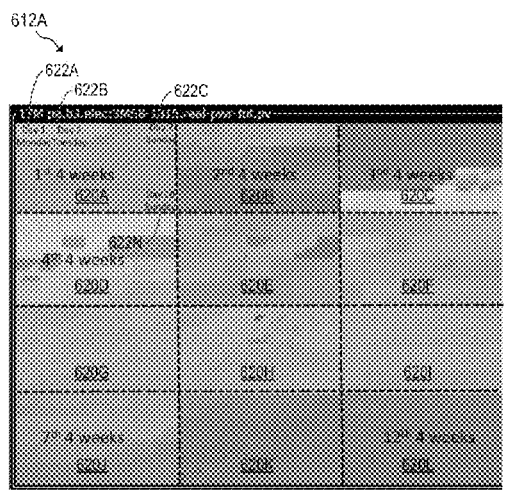
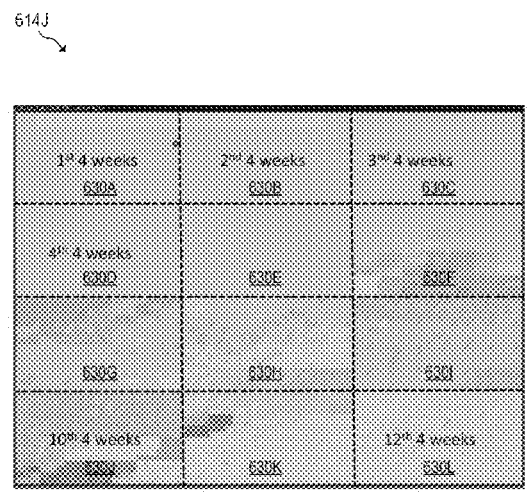
FIG. 6B  FIG. 6C

VISUAL ANALYTICS OF SPATIAL TIME SERIES DATA USING A PIXEL CALENDAR TREE

BACKGROUND

Modern commercial buildings include complex systems of sensors that collect various types of data (e.g., energy consumption data, temperature data, carbon monoxide levels, water cooling data, etc.). For example, a commercial building may include power meters that monitor power consumption in different regions of the building. The consumption data obtained by the power meters may be used to determine power usage patterns and anomalies in the building in order to optimize power savings.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The following detailed description references the drawings, wherein:

FIGS. 6A-6D are color diagrams of example pixel calendar trees of power consumption data collected from a number of buildings.

DETAILED DESCRIPTION

As detailed above, modern commercial buildings include complex networks or sensors for capturing various types of data. In many cases, the sensor data is analyzed to identify anomalies so that adjustments may be made to the building's configuration. For example, consumption data from power meters may be used to identify a particular region within a commercial building that is consuming a disproportionate amount of power. However, it is difficult to provide visualization tools that can simultaneously display and analyze measurements collected from all of the sensors (e.g., power meters) in a commercial building. Administrators of the commercial building are unable to simultaneously exploit sensor time series data from all sensors for identifying issues and inferring the root causes of anomalies.

Example embodiments disclosed herein provide visual analytics of spatial time series data using a pixel calendar tree. For example, in some embodiments, a computing device generates a sensor hierarchy including sensor nodes that are hierarchically arranged according to a physical infrastructure of a building, where each of the sensor nodes corresponds to a sensor. The computing device obtains the sensor data from the sensors and generates a pixel calendar tree based on the sensor data and the sensor hierarchy, where the pixel calendar tree is recursively subdivided into tree portions according to a proportion of the sensor data attributable to each sensor. At this stage, the computing device displays the pixel calendar tree, where each of the tree portions includes time series sensor data of a corresponding region of the building that is generated based on the sensor data.

In this manner, example embodiments disclosed herein provided improved visualization of sensor data from buildings by providing a pixel calendar tree with spatial time series data. Specifically, by providing a pixel calendar tree that reflects the physical infrastructure of a building, time series sensor data may be simultaneously reviewed for all regions of the building.

Figure 1:
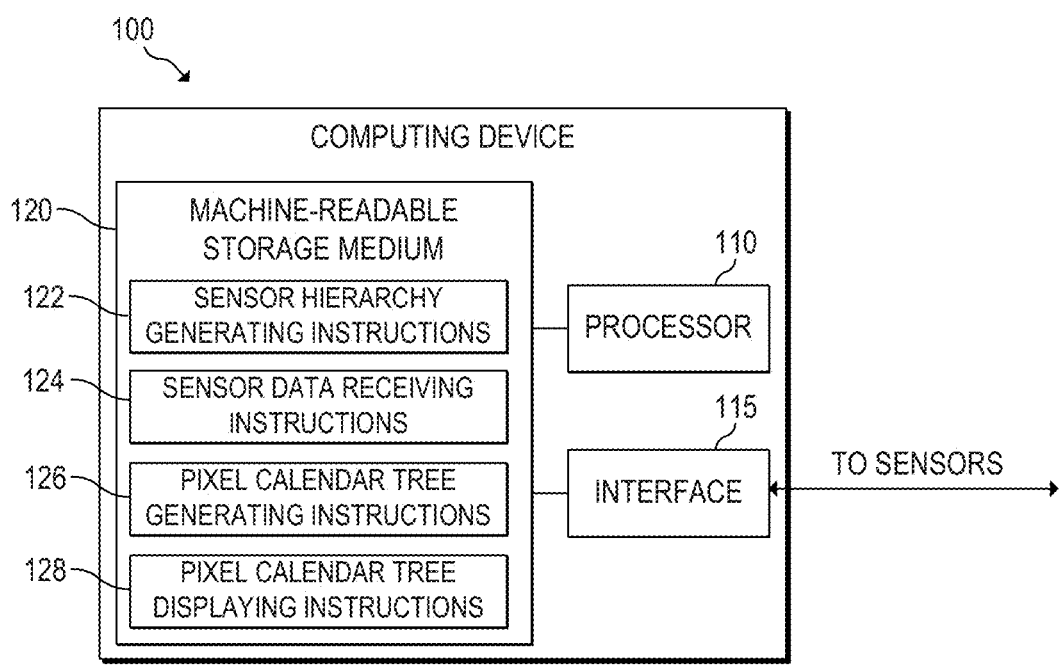
FIG. 1 is a block diagram of an example computing device for providing visual analytics of spatial time series data using a pixel calendar tree.

Referring now to the drawings, FIG. 1 is a block diagram of an example computing device 100 for providing visual analytics of spatial time series data using a pixel calendar tree. Computing device 100 may be any computing device (e.g., smartphone, tablet, laptop computer, desktop computer, etc.) capable of accessing sensor data that is obtained from sensors in a building, such as sensor A 250A and sensor N 250N of FIG. 2. In the embodiment of FIG. 1, computing device 100 includes a processor 110, an interface 115, and a machine-readable storage medium 120.

Processor 110 may be one or more central processing units (CPUs), microprocessors, and/or other hardware devices suitable for retrieval and execution of instructions stored in machine-readable storage medium 120. Processor 110 may fetch, decode, and execute instructions 122, 124, 126, 128 to enable visual analytics of spatial time series data using a pixel calendar tree, as described below. As an alternative or in addition to retrieving and executing instructions, processor 110 may include one or more electronic circuits comprising a number of electronic components for performing the functionality of one or more of instructions 122, 124, 126, 128.

Interface 115 may include a number of electronic components for communicating with sensors. For example, interface 115 may be an Ethernet interface, a Universal Serial Bus (USB) interface, an IEEE 1394 (Firewire) interface, an external Serial Advanced Technology Attachment (eSATA) interface, or any other physical connection interface suitable for communication with the sensors. Alternatively, interface 115 may be a wireless interface, such as a wireless local area network (WLAN) interface or a near-field communication (NFC) interface. In operation, as detailed below, interface 115 may be used to send and receive data, such as sensor data, to and from a corresponding interface of sensors.

Machine-readable storage medium 120 may be any electronic, magnetic, optical, or other physical storage device that stores executable instructions. Thus, machine-readable storage medium 120 may be, for example, Random Access Memory (RAM), an Electrically-Erasable Programmable Read-Only Memory (EEPROM), a storage drive, an optical disc, and the like. As described in detail below, machine-readable storage medium 120 may be encoded with executable instructions for providing visual analytics of spatial time series data using a pixel calendar tree.

Sensor hierarchy generating instructions 122 may generate a sensor hierarchy for sensors based on a physical infrastructure of a building. The sensor hierarchy may reflect the child-parent relationships between sensors within the building as described below with respect to FIG. 5A. For example, the sensor hierarchy may show the parent-child relationship between power meters and distribution boards of a building, where a main distribution board is the root node of the sensor hierarchy. Sensor hierarchy generating instructions 122 may generate the sensor hierarchy based on building plans and/or user inputs from an administrator.

Sensor data receiving instructions 124 may receive sensor data from sensors installed in a building. For example, power consumption data may be received from power meters installed at various locations in a building. Each of the sensors may be associated with a region (e.g., room, hallway, floor, wing, etc.) of the physical infrastructure of the building and arranged in a sensor hierarchy as discussed above, In some cases, sensor data receiving instructions 124 may receive the sensor data at regular intervals in real-time. Alternatively, the sensors may store sensor data collected at regular intervals and transmit the sensor data on a less regular basis (e.g., daily, weekly, monthly, etc.). Sensor data may be collected by various types of sensors such as power meters, thermometers, light sensors, etc.

Pixel calendar tree generating instructions 126 may generate a pixel calendar tree based on the sensor hierarchy and the sensor data. The pixel calendar tree may be divided into rectangles that are each associated with a sensor in the building, where the rectangles represent the location of the associated sensor within the sensor hierarchy as described below with respect to FIG. 5B. In this case, the size of each of the rectangles is proportional to a portion of sensor data that is attributable to the associated sensor. For example, a power meter reporting higher power consumption is displayed as a larger rectangle in the pixel calendar tree that is proportional to the associated region's percentage of power consumption in the entire building.

Pixel calendar tree generating instructions 126 may also include time series sensor data in each of the rectangles to represent the sensor data collected during each of the regular intervals by the sensors. For example, the sensors may collect sensor data every five minutes, and the time series sensor data may include a data entry for data collected during each of the data intervals.

Pixel calendar tree displaying instructions 128 may render the pixel calendar tree for displaying. For example, rectangles for each of the sensors may be resized and fitted such that children nodes fit into the rectangle of their parent node (i.e., rectangles for sensors installed in rooms cleanly fit into the parent rectangle for a distribution board of a floor in the building). In this example, rectangles may be arranged within their parent rectangles based on their relative size to each other (e.g., largest rectangle in the upper left to smallest rectangle in the lower right). The relative size of the rectangles may be proportional to the sensor data attributable to each of the sensors. For example, if the sensor data is power consumption data, the relative size of the rectangles may be determined based on the power consumption that is attributable to each of the corresponding power meters in the building. In this example, the power consumption data may also be used to data measurements, where the scale describes the range of data values from the minimum measured value to the maximum measured value in the power consumption data. The scale may then be used to determine the relative size of the power meter rectangles based on the power consumption data attributable to each of the power meters.

Time series sensor data may be rendered as pixels within the rectangles, where each pixel represents sensor data collected during a time interval by the associated sensor. Further, each pixel may be color coded based on the value of the sensor data. For example, high power consumption during a time interval may be rendered as a red pixel while low power consumption during a time interval may be rendered as a violet pixel. Examples of rendered pixel calendar trees are described below with respect to FIGS. 6A-6D.

The rendered pixel calendar tree allows a user to simultaneously view time series sensor data for all regions of a building on a single display. In some cases, sensor data from multiple buildings may be analyzed and rendered into a combined pixel calendar tree as discussed above, where each building is represented as a rectangle in the pixel calendar tree.

Figure 2:
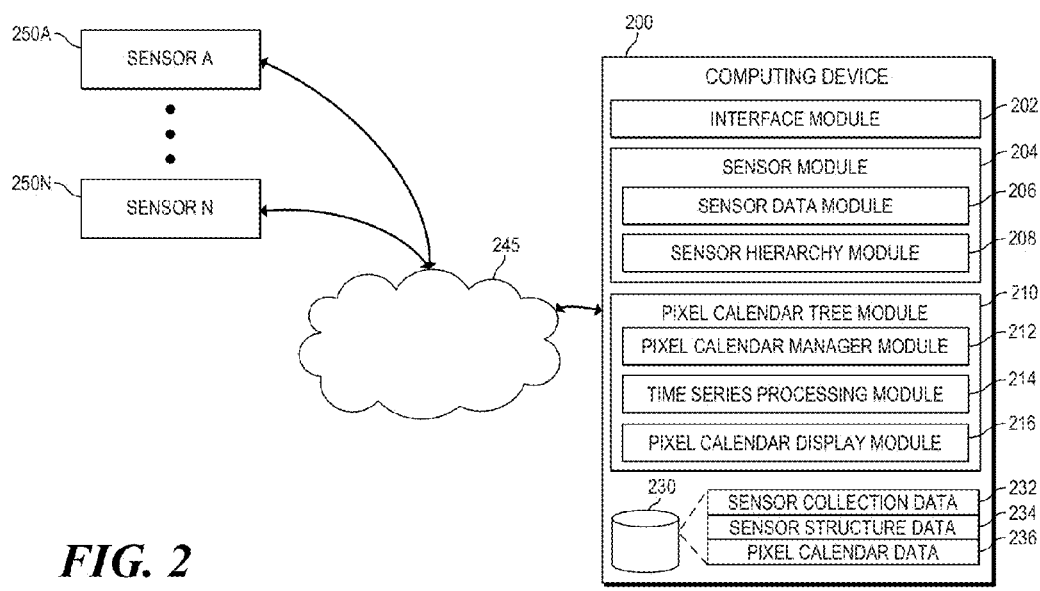
FIG. 2 is a block diagram of an example computing device in communication with sensors for providing visual analytics of spatial time series data using a pixel calendar tree.

FIG. 2 is a block diagram of an example computing device 200 in communication via a network 245 with sensors (e.g., sensor A 250A, sensor N 250N). As illustrated in FIG. 2 and described below, computing device 200 may communicate with sensors to provide visual analytics of spatial time series data using a pixel calendar tree.

As illustrated, computing device 200 may include a number of modules 202-216. Each of the modules may include a series of instructions encoded on a machine-readable storage medium and executable by a processor of the computing device 200. In addition or as an alternative, each module may include one or more hardware devices including electronic circuitry for implementing the functionality described below.

As with computing device 100 of FIG. 1, computing device 200 may be a notebook, desktop, tablet, workstation, mobile device, or any other device suitable for executing the functionality described below. As detailed below, computing device 200 may include a series of modules 202-216 for providing visual analytics of spatial time series data using a pixel calendar tree.

Interface module 202 may manage communications with the sensors (e.g., sensor A 250A, sensor N 250N). Specifically, the interface module 202 may initiate connections with the sensors and receive sensor collection data 232 from the sensors.

Sensor module 204 may manage sensor data obtained from the sensors (e.g., sensor A 250A, sensor N 250N) and other sources. Although the components of sensor module 204 are described in detail below, additional details regarding an example implementation of module 204 are provided above in connection with instructions 122 and 124 of FIG. 1.

Sensor data module 206 may process sensor data received from the sensors (e.g., sensor A 250A, sensor N 250N). The sensor data may include measurements (e.g., power consumption, temperature, etc.) collected by the sensors (e.g., sensor A 250A, sensor N 250N) at regular intervals. The sensor data may also include an identifier (e.g., numeric identifier, alpha-numeric identifier, globally unique identifier, etc.) that is associated with the related sensor (e.g., sensor A 250A, sensor N 250N) providing the sensor data. In this manner, sensor data module 206 may continually receive sensor data from the sensors (e.g., sensor A 250A, sensor N 250N) and compile the sensor data into time series sensor data that is stored as sensor collection data 232 in storage device 230. The time series sensor data may include data records for the measurements taken during each interval so that the time series sensor data may be incorporated into a pixel calendar.

Sensor data module 206 may also generate summary information for each of the sensors (e.g., sensor A 250A, sensor N 250N) based on the sensor data. For example, sensor data module 206 may determine the cumulative power consumption of a power meter over an extended period of time (e.g., a day, a week, a month, etc.). The summary information may be linked to an identifier associated with the power meter in the sensor collection data 232 of storage device 230 so that the summary information may be used by the pixel calendar tree module 210.

Sensor hierarchy module 208 may generate a sensor hierarchy based on the physical infrastructure of a building that includes sensors (e.g., sensor A 250A, sensor N 250N). A sensor hierarchy may reflect the layout and connections between sensors (e.g., sensor A 250A, sensor N 250N) in a building such as described below with respect to FIG. 5A. For example, a sensor hierarchy for power meters may reflect the parent-child relationship between distribution boards and power meters installed in a building. The physical infrastructure of a building for building a sensor hierarchy may be determined based on digital plans of the building and/or inputs from an administrator of computing device 200. For example, sensor hierarchy module 208 may provide a user interface for specifying a sensor hierarchy for sensors (e.g., sensor A 250A, sensor N 250N) connected to computing device 200. The connected sensors (e.g., sensor A 250A, sensor N 250N) may provide some information related to the physical infrastructure of buildings such as building identifiers, floor identifiers, etc. In this case, the user interface may group connected sensors based on their building or floor and allow the administrator to specify the sensor hierarchy of the connected sensors. Sensor hierarchies may be stored as sensor structure data 234 in storage device 230.

Pixel calendar tree module 210 may manage pixel calendar trees that are generated based on sensor data processed by the sensor module 204. Although the components of pixel calendar tree module 210 are described in detail below, additional details regarding an example implementation of module 210 are provided above in connection with instructions 126 and 128 of FIG. 1.

Pixel calendar manager module 212 may generate pixel calendar trees based on sensor hierarchies and sensor data. Specifically, a pixel calendar tree may initially be generated using a sensor hierarchy and sensor summary information. The sensor hierarchy may be used to determine how nested rectangles representing the sensors should be arranged within the pixel calendar tree (i.e., rectangles for child sensors being displayed within their respective parent sensor's rectangle). Further, the sensor summary information may be used to determine the dimension of the sensor rectangles within the pixel calendar tree. For example, rectangles for power meters may be generated to be proportional to the cumulative power consumption of the power meters during a global time period (i.e., time period that includes all time intervals of the sensor data) of the pixel calendar tree. In this example, the aspect ratio of the rectangles may be recursively adjusted to find the best fit for all rectangles in the pixel calendar tree. The best fit algorithm may be applied from the top to the bottom of the sensor hierarchy such that the best fit for a level of parent nodes is determined before the best fit of each of their child nodes is determined and so on.

Time series processing module 214 may process time series sensor data from sensor module 204 so that the time series sensor data may be included in a pixel calendar tree. Specifically, the time series sensor data may be associated with the pixel calendar tree so that each sensor rectangle includes the time series sensor data from the corresponding sensor. A rendering style may be generated for the time series sensor data based on a range of data values in the sensor data and the size of the sensor rectangles. For example, a color map may be generated to represent the range of data values in a pixel calendar. In this example, the amount of data represented in each pixel may be determined based on the size of a sensor rectangle. A smaller sensor rectangle may include more time intervals of sensor data in each pixel to allow for the entirety of the time series sensor data to be simultaneously displayed. In this case, the rendering style may be configured to render the time intervals separately if the user zooms into the sensor rectangle.

Pixel calendar display module 216 may render pixel calendar trees for display on a display device (not shown) of computing device 200. For example, pixel calendar trees may be rendered for display as described below with respect to FIGS. 6A-6D. The pixel calendar tree may be rendered such the sensor rectangles are nested within each other according to the sensor hierarchy. Further, the sensor rectangles may be arranged according to the relative size of each of the sensor rectangle with respect to their sibling rectangles (i.e., rectangles sharing a common parent in the sensor hierarchy). In this way, the time series sensor data for all sensors in the sensor hierarchy may be simultaneously displayed for review by a user. The rendered pixel calendar tree may be stored as pixel calendar data 236 in storage device 230.

Storage device 230 may be any hardware storage device for maintaining data accessible to computing device 200. For example, storage device 230 may include one or more hard disk drives, solid state drives, tape drives, and/or any other storage devices. The storage devices 230 may be located in computing device 200 and/or in another device in communication with computing device 200. As detailed above, storage device 230 may maintain sensor collection data 232, sensor structure data 234, and pixel calendar data 236.

Sensors (e.g., sensor A 250A, sensor N 250N) may be any sensor device operatively connected to computing device 200 over the network 245 that is suitable for collecting measurements of characteristics (e.g., power consumption, temperature, etc.) related to a building. Sensors (e.g., sensor A 250A, sensor N 250N) may provide sensor data that includes measurements collected at regular intervals.

Figure 3:
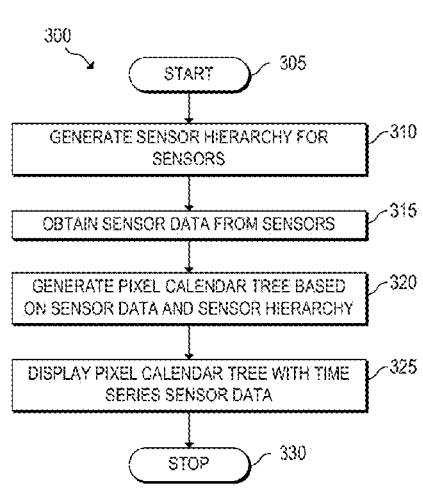
FIG. 3 is a flowchart of an example method for execution by a computing device for providing visual analytics of spatial time series data using a pixel calendar tree.

FIG. 3 is a flowchart of an example method 300 for execution by a computing device 100 for providing visual analytics of spatial time series data using a pixel calendar tree. Although execution of method 300 is described below with reference to computing device 100 of FIG. 1, other suitable devices for execution of method 300 may be used, such as computing device 200 of FIG. 2. Method 300 may be implemented in the form of executable instructions stored on a machine-readable storage medium, such as storage medium 120, and/or in the form of electronic circuitry.

Method 300 may start in block 305 and continue to block 310, where computing device 100 may generate a sensor hierarchy for sensors installed in a building. The sensor hierarchy may be generated based on a building plan showing the physical infrastructure of the building. The building plan may be in a digital format that can be interpreted by the computing device 100. Further, an administrator of computing device 100 may provide inputs for defining the child-parent relationships between sensors. Once completed, the sensor hierarchy reflects the configuration of the sensors as installed in the building, where parent-child relationships between the sensors are shown.

In block 315, sensor data is obtained from the sensors by the computing device 100. The sensor data may include measurements collected by the sensors at regular intervals.

In block 320, a pixel calendar tree is generated based on the sensor data and the sensor hierarchy. The sensor hierarchy may be used to initially determine the layout of sensor rectangles in the pixel calendar tree. At this stage, the sensor data may be used to determine the relative size and aspect ratios of the sensor rectangles within the pixel calendar tree. For example, each sensor rectangle may be proportionally sized according to the total power consumption measured by a corresponding sensor. Further, the sensor rectangles may be arranged according to the relative size of each of the sensor rectangle with respect to their sibling rectangles (i.e., rectangles sharing a common parent in the sensor hierarchy). Finally, time series sensor data (i.e., the measurements collected at regular intervals) may be associated with each of the sensor rectangles.

In block 325, the pixel calendar tree is displayed with the time series sensor data. For example, the pixel calendar tree may be displayed as described below with respect to FIGS. 6A-6D. In this example, the time series sensor data is shown as a pixel calendar within each of the sensor rectangles, which allows a user to simultaneously view time series sensor data from all sensors in the building. Method 300 may then continue to block 330, where method 300 may stop.

Figure 4:
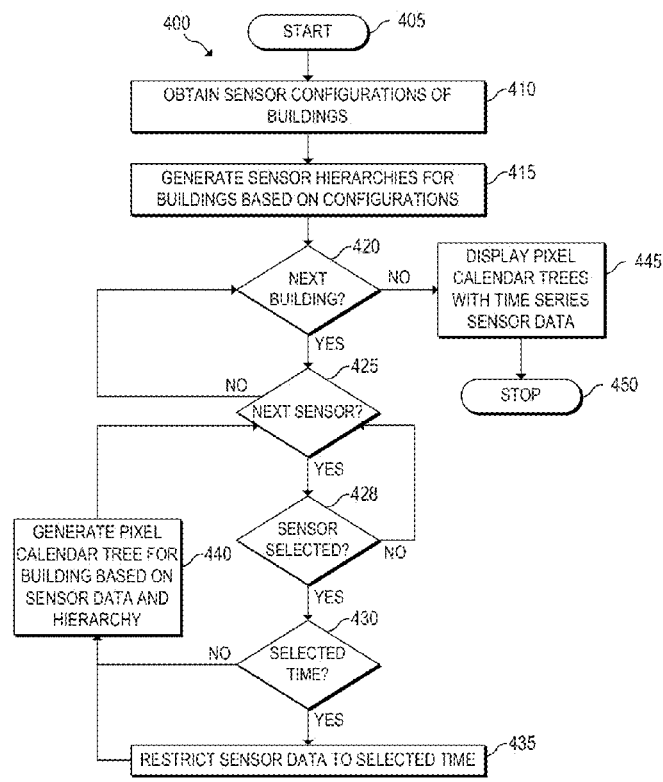
FIG. 4 is a flowchart of an example method for execution by a computing device for providing visual analytics of spatial time series data collected from a multiple buildings using a pixel calendar tree.

FIG. 4 is a flowchart of an example method 400 for execution by a computing device 200 for providing visual analytics of spatial time series data collected from a number of buildings using a pixel calendar tree. Although execution of method 400 is described below with reference to computing device 200 of FIG. 2, other suitable devices for execution of method 400 may be used, such as computing device 100 of FIG. 1. Method 400 may be implemented in the form of executable instructions stored on a machine-readable storage medium and/or in the form of electronic circuitry.

Method 400 may start in block 405 and continue to block 410, where computing device 200 obtains sensor configurations for buildings. The sensor configurations may be digital building plans and/or user inputs from an administrator of computing device 200, A sensor configuration may describe the location and configuration of sensors within the physical infrastructure of a building. In block 415, a sensor hierarchy is created for each of the buildings using a corresponding sensor configuration.

In block 420, it is determined if there is a next building in the list of buildings to process. If there is an additional building to process, it is determine if there is a next sensor in the additional building to process in block 425. If there are no more sensors in the building to process, method 400 returns to block 420, where it is determined if there is a next building to process.

If there for a next sensor in the building to process, it is determined if the next sensor has been selected for processing by the user in block 428. For example, a subset of sensors in a building may be selected for processing as discussed with respect to FIG. 60 below. If the next sensor has not been selected for processing, method 400 returns to block 425, where it is determined if there is a next sensor to process.

If the next sensor has been selected for processing, it is determined if the user has selected a time interval for the sensor data in block 430. For example, a time interval for the sensor data may be selected as discussed with respect to FIG. 6D below. If a time interval for the sensor data is selected, the generation of the pixel calendar tree described below is restricted to sensor data occurring within the time interval in block 435. In block 440, a pixel calendar tree is generated for the building based on its sensor hierarchy and sensor data. The pixel calendar tree may be generated as described above with respect to FIG. 3.

If there is no additional building to process, method 400 proceeds to block 445, where the pixel calendar trees of the buildings are displayed with time series sensor data. The pixel calendar trees of the buildings may be arranged according to the total sensor data attributable to each of the buildings. Further, similar to the sensor rectangles, the aspect ratios of the pixel calendar trees for the buildings may be adjusted to find the best fit in a combined pixel calendar tree. The display of the combined pixel calendar tree allows the user to view the time series sensor data of all the buildings and all their sensors on a single display. Method 400 may then continue to block 450, where method 400 may stop.

Figures 5A, 5B:
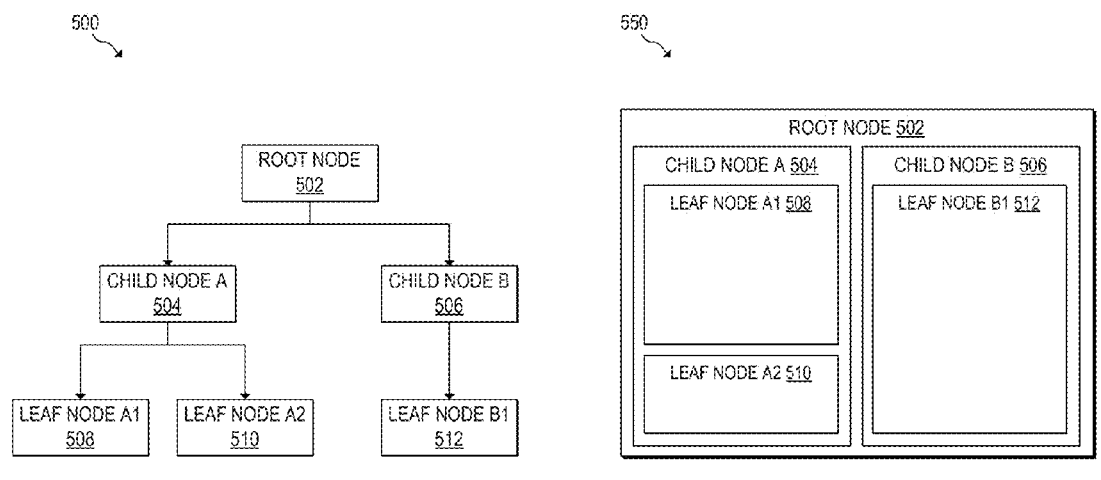
FIG. 5A is a diagram of a sensor hierarchy for sensors in a building.
FIG. 5B is a diagram of a preliminary pixel calendar tree for sensors in a building.

FIG. 5A is a diagram of an example sensor hierarchy 500 for generating a pixel calendar tree. The sensor hierarchy 500 may represent the sensor configuration of sensors within the physical infrastructure of a building. Root node 502 of sensor hierarchy 500 may represent a main panel or sensor that is directly or indirectly connected to all other sensors in sensor hierarchy 500. For example, root node 502 may represent a main distribution board in a sensor hierarchy 500 for power meters. Child node A 504 and Child node B 506 are the direct children of root node 502 in sensor hierarchy 500. Typically, the child nodes (e.g., child node A 504, child node B 506) of root node 502 represent intermediate sensor units covering a section (e.g., floor, wing, etc.) of the building. For example, the child nodes may represent intermediate distribution boards that are installed on each floor of the building.

Leaf node A1 508, leaf node A2 510, and leaf node B1 512 represent sensors installed within the building. Leaf node A1 508 and leaf node A2 510 share child node A 504 as a parent node, and leaf node B1 512 has child node B 506 as a parent node. For example, the leaf nodes (e.g., leaf node A1 508, leaf node A2 510, leaf node B1 512) may represent power meters that are installed at various locations in the buildings and are connected to intermediate distribution boards, which in turn are connected to the main distribution board. In this example, sensor data may travel from the power meters up through the distribution boards as shown in the sensor hierarchy 500, where the main distribution board provides the sensor data to a computing device such as computing device 100 of FIG. 1 or computing device 200 of FIG. 2.

Sensor hierarchy 500 may include additional intermediate nodes depending on the sensor configuration. Further, any number of nodes may be included in sensor hierarchy 500 depending on the number of sensors installed in the building.

FIG. 5B is a diagram of an example preliminary pixel calendar tree 550 for providing visual analytics of spatial time series data. The example in FIG. 5B is preliminary in that it does not include time series data, which is included in the pixel calendar trees described below with respect to FIGS. 6A-6D, Pixel calendar tree 550 includes sensor rectangles for each of the nodes of sensor hierarchy 500 of FIG. 5A, Root node 502 is shown as the largest, all-encompassing sensor rectangle in pixel calendar tree 550, which shows that all sensor data received for the building is attributable to the main distribution board. The size of each of the sensor rectangles in pixel calendar tree 550 corresponds to the proportion of sensor data that is attributable to the sensor. Further, the placement of the sensor rectangles in pixel calendar tree mirrors the hierarchy shown in sensor hierarchy 500 of FIG. 5A.

The child nodes 504, 506 of root node 502 are shown as sensor rectangles within the sensor rectangle for root node 502. The child nodes 504, 506 are each shown as a sensor rectangle that is approximately half the size of the root sensor rectangle 502. In this example, half of the sensor data is attributable to each of the child nodes 504, 506. Child node A 504 includes sensor rectangles for leaf node A1 508 and leaf node A2 510, where the sensor rectangle for leaf node A1 508 is approximately 70% the size of child node A's 504 sensor rectangle and the sensor rectangle for leave node A2 510 is approximately 30% the size of the size of child node A's 504 sensor rectangle. Accordingly, 70% of the sensor data attributable to child node A 504 is attributable to leaf node A1 508, and 30% of the sensor data attributable to child node A 504 is attributable to leaf node A2 510. Child node B 506 only includes leaf node B1 512; thus, all of the sensor data attributable to child node B 506 is also attributable to leaf node B1 512.

Figure 6A:
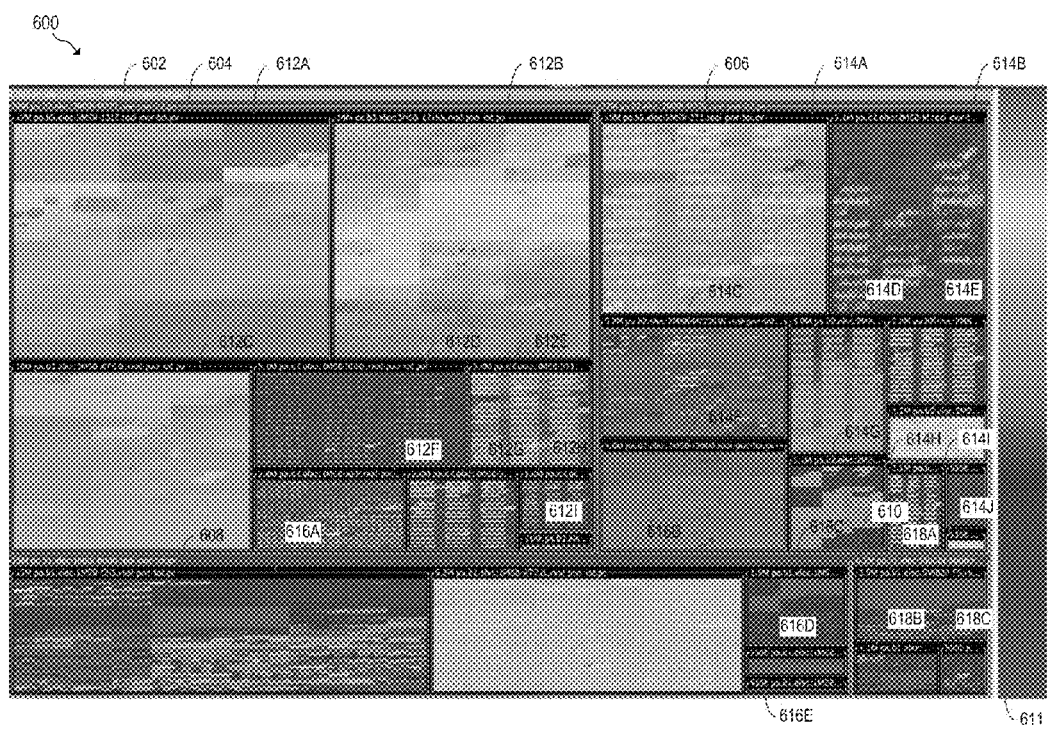

FIGS. 6A-6D are diagrams of example pixel calendar trees including time series consumption data for a building. In FIG. 6A, pixel calendar tree 600 includes a main meter rectangle 602 that represents a main distribution board installed in the building. The main sensor rectangle 602 includes four intermediate meter rectangles 604, 606, 608, 610 that represent intermediate distribution boards installed in the building. As discussed above, the size of each of the intermediate meter rectangles 604, 606, 608, 610 is proportional to the amount of consumption data that is attributable to their corresponding intermediate distribution board.

In this case, intermediate meter rectangle 604 shows the greatest power consumption and includes power meter rectangles 612A-612I. The size of each of the power meter rectangles 612A-612I is proportional to the amount of consumption data that is attributable to their corresponding power meter. Further, each of the power meter rectangles 612A-612I includes a pixel calendar that displays time series consumption data. Specifically, each pixel in the power meter rectangles 612A-612I represents the amount of power consumption occurring during a time interval according to the consumption color map 611 for representing the scale of the power consumption data displayed. In this consumption color map 611, violet signifies low power consumption while red signifies high power consumption. Each of the other intermediate meter rectangles 606, 608, 610 similarly includes corresponding power meter rectangles 614A-614J, 616A-616E, 618A-618C.

FIG. 6B shows a magnified display of power meter rectangle 612A associated with a power meter. The magnified display may be accessed by a user selecting power meter rectangle 612A in pixel calendar tree 600. The magnified display includes four week portions 620A-620L that combined show time series consumption data over a 48 week time period. Each of the four week portions 620A-620L includes daily portions such as 622A-622N that are presented as colored pixels representing the power consumption of the power meter each day. In FIG. 6B, a majority of the daily portions are shown as dark orange, which shows that the power consumption of the associated power meter is on average very high over the 48 week time period. In this example, anomalies can be seen in the four week portions 620O and 620D. Specifically, four week portion 620O shows a weekend in the third week with very low power consumption, which is followed by a period of moderate power consumption. The moderate power consumption continues into the first week and a half of four week portion 620D. The identified anomalies may allow the user to predict usage patterns of the building and to optimize power consumption by, for example, identifying power saving practices that may be occurring during the anomalies. Uncharacteristically high usage months may also be seen in the four week portions 620K and 620L. In this case, the behaviors of the tenants of the building during the four week portions 620K and 620L may be examined to identify the cause of the high power consumption.

Similar to FIG. 6B as discussed above, FIG. 6C shows a magnified display of power meter rectangle 612J associated with a power meter. The magnified display includes four week portions 630A-630L that combined show time series consumption data over a 48 week time period. In FIG. 6C, a majority of the daily portions are shown as yellow, which shows that the power consumption of the associated power meter is on average slightly lower than the power consumption shown in FIG. 6B. In this example, an anomaly can be seen in the four week portion 630F. Specifically, four week portion 630F shows a Thursday in the second week and the first three days of the third week with very low power consumption, which is followed by a period of relatively higher power consumption. Uncharacteristically high usage months may also be seen in the four week portions 630J and 630K. Again, the behaviors of the tenants of the building during the four week portions 630J and 630K may be examined to identify the cause of the high power consumption.

Figure 6D:
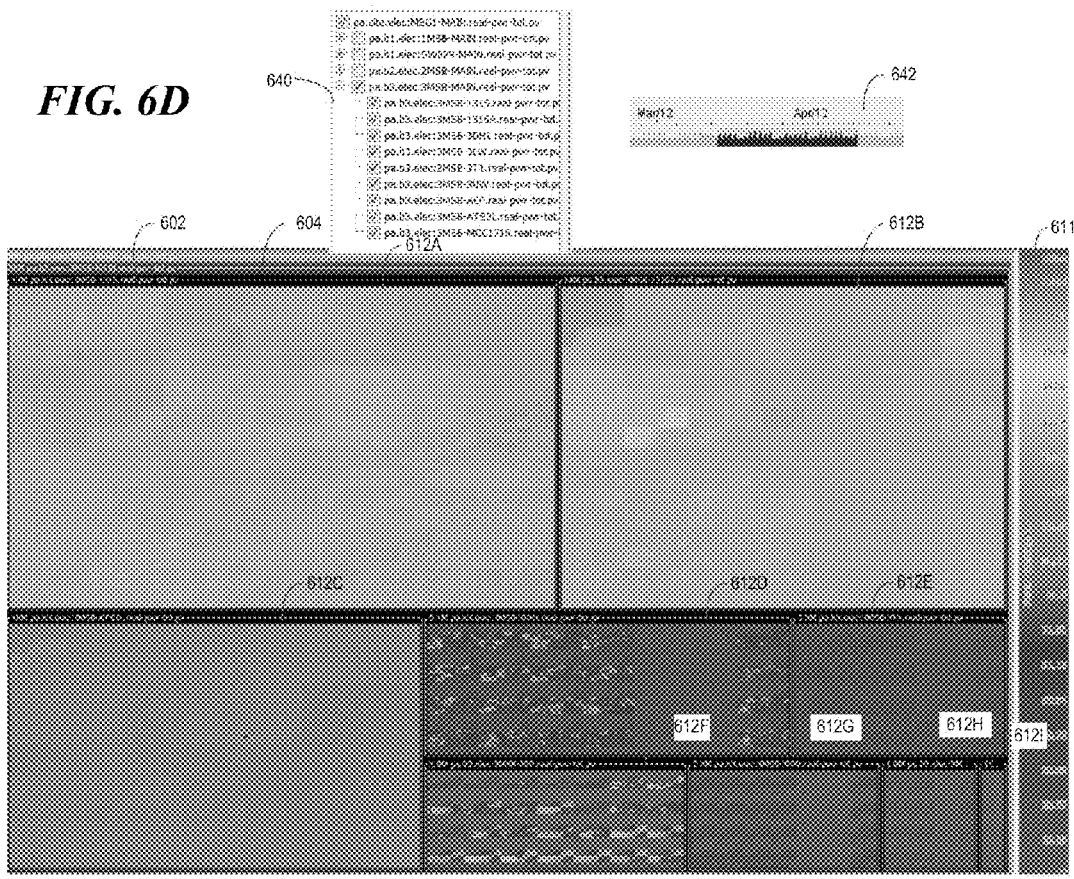

FIG. 6D shows a pixel calendar tree for intermediate rectangle 604 with selected subsets of sensor data. In this case, main rectangle 602 only includes intermediate rectangle 604 because the user has selected intermediate rectangle 604 and all of its power meter rectangles 612A-612I in the meter selection control 640. As the user changes his selection in the meter selection control 640, the pixel calendar tree may be updated to only include rectangles for the selected meters. The user may also use the time period selection control 642 to restrict the sensor data to a particular time period. Similar to the meter selection control 640, the pixel calendar tree may be updated to only include time series sensor data for the selected time period.

The foregoing disclosure describes a number of example embodiments for providing visual analytics of spatial time series data using a pixel calendar tree. In this manner, the embodiments disclosed herein enable time series data from multiple sensors to be simultaneously displayed using a pixel calendar tree format that reflects a sensor hierarchy of the sensors.

We claim:

1. A system for providing visual analytics of spatial time series data using a pixel calendar tree, the system comprising:
   a plurality of sensors each positioned to obtain sensor data for one of a plurality of regions within a budding, wherein the sensor data is divided into data segments that are collected at regular time intervals;
   a processor operatively connected to the plurality of sensors, the processor to:
      generate a sensor hierarchy comprising a plurality of sensor nodes that are hierarchically arranged according to a physical infrastructure of the building, wherein each node of the plurality of sensor nodes corresponds to one of the plurality of sensors;
      obtain the sensor data from the plurality of sensors;
      generate the pixel calendar tree based on the sensor data and the sensor hierarchy, wherein the pixel calendar tree is recursively subdivided into a plurality of tree portions according to a proportion of the sensor data attributable to each of the plurality of sensors, and wherein the plurality of tree portions are hierarchically arranged in the pixel calendar tree according to the sensor hierarchy; and display the pixel calendar tree, wherein each of the plurality of tree portions includes time series sensor data of a corresponding region of the plurality of regions that is generated based on the sensor data.

2. The system of claim 1, wherein each of the plurality of tree portions is a sensor rectangle that is approximately proportional to the proportion of the sensor data attributable to an associated sensor node of the plurality of sensor nodes, and wherein each sensor rectangle is arranged within the pixel calendar tree from largest sensor rectangle to smallest sensor rectangle according to a relative size of the sensor rectangle as compared to sibling rectangles of the sensor rectangle.

3. The system of claim 2, wherein the time series sensor data is displayed as a pixel calendar that includes a plurality of color-mapped pixels that each represent a characteristic detected by one of the plurality of sensors during a time interval.

4. The system of claim 1, wherein the processor is further to:

receive a selection of a subset of the plurality of sensor nodes; and update the display of the pixel calendar tree to show related tree portions of the plurality of tree portions that are associated with the subset.

5. The system of claim 1, wherein the processor is further to:

in response to a selection of a time period of the sensor data, generate a temporal pixel calendar tree based on the selected time period; and display the temporal pixel calendar tree, wherein a temporal subset of the time series sensor data that corresponds to the selected time period is displayed in the regional pixel calendar tree.

6. The system of claim 1, wherein the processor is further to:

generate an additional pixel calendar tree for an additional building, wherein the pixel calendar tree and the additional pixel calendar tree are combined in a joint pixel calendar tree, and wherein a size of each of the pixel calendar tree and the additional pixel calendar tree is proportional to the sensor data attributable to each.

7. A method for providing visual analytics of spatial time series data using a pixel calendar tree, the method comprising:

generating a sensor hierarchy comprising a plurality of sensor nodes that are hierarchically arranged according to a physical infrastructure of the building, wherein each node of the plurality of sensor nodes corresponds to one of a plurality of sensors;

obtaining sensor data from the plurality of sensors, wherein each of the plurality of sensors is positioned to obtain the sensor data for one of a plurality of regions within a building;

generating the pixel calendar tree based on the sensor data and the sensor hierarchy, wherein the pixel calendar tree is recursively subdivided into a plurality of tree portions according to a proportion of the sensor data attributable to each of the plurality of sensors; and sending the pixel calendar tree to a display device, wherein each of the plurality of tree portions includes time series sensor data of a corresponding region of the plurality of regions that is generated based on the sensor data.

8. The method of claim 7, wherein each of the plurality of tree portions is a sensor rectangle that is approximately proportional to the sensor data attributable to an associated sensor node of the plurality of sensor nodes, and wherein the plurality of tree portions are hierarchically arranged in the pixel calendar tree according to the sensor hierarchy, and wherein each sensor rectangle is arranged within the pixel calendar tree from largest sensor rectangle to smallest sensor rectangle according to a relative size of the sensor rectangle as compared to sibling rectangles of the sensor rectangle.

9. The method of claim 8, wherein the time series sensor data is displayed as a pixel calendar that includes a plurality of color-mapped pixels that each represent a characteristic detected by one of the plurality of sensors during a time interval.

10. The method of claim 7, further comprising:

in response to a selection of a time period of the sensor data, generating a temporal pixel calendar tree based on the selected time period; and displaying the temporal pixel calendar tree, wherein a temporal subset of the time series sensor data that corresponds to the selected time period is displayed in the regional pixel calendar tree.

11. The method of claim 7, further comprising:

generating an additional pixel calendar tree for an additional building, wherein the pixel calendar tree and the additional pixel calendar tree are combined in a joint pixel calendar tree, and wherein a size of each of the pixel calendar tree and the additional pixel calendar tree is proportional to the sensor data attributable to each.

12. A non-transitory machine-readable storage medium encoded with instructions executable by a processor, the machine-readable storage medium comprising instruction to:

generate a power meter hierarchy comprising a plurality of power meter nodes that are hierarchically arranged according to a physical infrastructure of the building, wherein each node of the plurality of power meter nodes corresponds to one of a plurality of power meters;

obtain power consumption data from the plurality of power meters, wherein each of the plurality of power meters is positioned to obtain the power consumption data for one of a plurality of regions within a building;

generate a pixel calendar tree based on the power consumption data and the power meter hierarchy, wherein the pixel calendar tree is recursively subdivided into a plurality of tree portions according to a proportion of the power consumption data attributable to each of the plurality of power meters; and display the pixel calendar tree, wherein each of the plurality of tree portions includes time series power consumption data of a corresponding region of the plurality of regions that is generated based on the power consumption data.

13. The storage medium of claim 12, wherein each of the plurality of tree portions is a meter rectangle that is approximately proportional to the power consumption data attributable to an associated meter node of the plurality of power meter nodes, and wherein the plurality of tree portions are hierarchically arranged in the pixel calendar tree according to the power meter hierarchy.

14. The storage medium of claim 13, wherein the time series power consumption data is displayed as a pixel calendar that includes a plurality of color-mapped pixels that each represent a characteristic detected by one of the plurality of power meters during a time interval.

15. The storage medium of claim 12, further comprising instruction to:
  generate an additional pixel calendar tree for an additional building, wherein the pixel calendar tree and the additional pixel calendar tree are combined in a joint pixel calendar tree, and wherein a size of each of the pixel calendar tree and the additional pixel calendar tree is proportional to the power consumption data attributable to each.

* * * * *